United States Patent
Koyama et al.

(10) Patent No.: US 9,136,263 B2
(45) Date of Patent: Sep. 15, 2015

(54) SEMICONDUCTOR DEVICE

(71) Applicant: SEIKO INSTRUMENTS INC., Chiba (JP)

(72) Inventors: Takeshi Koyama, Chiba (JP); Tomomitsu Risaki, Chiba (JP)

(73) Assignee: SEIKO INSTRUMENTS INC. (JP)

(*) Notice: Subject to any disclaimer, the term of this patent is extended or adjusted under 35 U.S.C. 154(b) by 0 days.

(21) Appl. No.: 14/166,937

(22) Filed: Jan. 29, 2014

(65) Prior Publication Data

US 2014/0217510 A1 Aug. 7, 2014

(30) Foreign Application Priority Data

Feb. 5, 2013 (JP) .................................. 2013-020714

(51) Int. Cl.
H01L 27/02 (2006.01)

(52) U.S. Cl.
CPC ........ *H01L 27/0266* (2013.01); *H01L 27/0277* (2013.01)

(58) Field of Classification Search
CPC ..................... H01L 29/41758; H01L 23/4824; H01L 27/0266; H01L 27/0277
See application file for complete search history.

(56) References Cited

U.S. PATENT DOCUMENTS

| 5,777,366 | A  | * | 7/1998  | Contiero et al. | 257/355 |
| 8,236,640 | B2 | * | 8/2012  | Smith           | 438/221 |
| 8,373,231 | B2 | * | 2/2013  | Yamamoto et al. | 257/355 |
| 8,592,919 | B2 | * | 11/2013 | Inoue           | 257/401 |
| 8,754,469 | B2 | * | 6/2014  | Pendharkar et al.| 257/328 |

OTHER PUBLICATIONS

Patent Abstracts of Japan, Publication No. 07-045829, Publication Date Feb. 14, 1995.

* cited by examiner

*Primary Examiner* — William Coleman
(74) *Attorney, Agent, or Firm* — Adams & Wilks

(57) ABSTRACT

Provided is a semiconductor device which uses a comb-like N-type MOS transistor as an ESD protection element and is capable of uniformly operating the entire comb-like N-type MOS transistor. By adjusting a length L of a gate electrode of the N-type MOS transistor used as the ESD protection element in accordance with the distance from a contact for fixing a substrate potential, which is provided on a guard ring around an outer periphery, respective portion of N-type MOS transistor represented as a comb teeth uniformly enter snap-back operation, permitting avoidance of local concentration of current and obtainment of a desired ESD tolerance.

11 Claims, 4 Drawing Sheets

SEMICONDUCTOR DEVICE

BACKGROUND OF THE INVENTION

1. Field of the Invention

The present invention relates to a semiconductor device, in particular, to a semiconductor device using an N-type MOS transistor as an ESD protection element.

2. Description of the Related Art

In a semiconductor device including a MOS transistor, in order to prevent electrostatic breakdown of an internal circuit by static electricity from a pad for external connection (VDD), an off transistor provided under a state in which a gate potential of an N-type MOS transistor is fixed to a ground potential (Vss) so as to be in an off state is often used as an ESD protection element.

The off transistor should have a channel width (W) which is larger than that of an ordinary internal MOS transistor structure since an off transistor must flow the entire current caused by the static electricity in a short time and in a large amount. As a result, it is often the case that the entire channel width of an off transistor is increased by adopting a structure of a multi-finger type in which a plurality of drain regions, source regions, and gate regions are combined in the shape of a comb.

However, due to the structure in which a plurality of transistors are combined, it is difficult for the entire MOS transistor for ESD protection to operate uniformly, and there is a problem in that only a comb tooth which first enters parasitic bipolar operation cannot receive the entire ESD surge, resulting in local breakdown. A substrate contact for fixing the gate potential of the off transistor to a ground potential is provided for a guard ring which is provided around the off transistor. Since a guard ring is generally provided to surround an ESD protection element, the distance from the substrate contact provided around the comb-like ESD protection element to the respective unit tooth ESD protection elements, that is, to the respective bases of the parasitic bipolar transistors varies. Specifically local voltage difference as a trigger at which the parasitic bipolar transistor formed between a source region and a channel region after avalanche breakdown is turned on varies because the base resistance varies among the comb teeth. The timing of operation of the parasitic bipolar transistor varies among the respective unit ESD protection elements. Accordingly current concentrates on the unit ESD protection element having the parasitic bipolar transistor which has been turned on the earliest, resulting in local breakdown.

As a measure for preventing this phenomenon, a layout method has been proposed in which, by decreasing the distance between a contact in a drain region and a gate electrode as an external connection element becomes farther so as to increase the speed of operation of the transistor, the entire comb teeth uniformly enter a snap-back state that is the beginning of bipolar operation (see, for example, Japanese Published Patent Application No. H07-45829).

However, the above-mentioned method has problems in that, as the width of the drain region is reduced, it becomes more difficult to secure a desired position of the contact, and, as the resistance of the interconnecting line becomes lower due to the interconnecting line containing a high-melting point metal in recent years, the propagation speed of the surge becomes further faster, and there are cases in which only the distance between the contact and the gate electrode cannot make a complete adjustment.

SUMMARY OF THE INVENTION

In order to solve the above-mentioned problems, according to one embodiment of the present invention, a semiconductor device is structured as follows.

In an N-type MOS transistor for ESD protection having an integral structure of a plurality of transistors in which a plurality of drain regions and a plurality of source regions are alternately formed, a gate electrode is formed between each of the drain regions and each of the source regions, and a substrate contact for fixing a potential of the gate electrode to a ground potential is formed on a guard ring around an outer periphery, the drain regions are electrically connected to an external connection terminal and the source regions are electrically connected to a ground potential supply line, and a length L of a single comb tooth of the gate electrode is reduced as the distance from the substrate contact, whose potential is fixed at the ground potential and provided around the outer periphery, becomes smaller, and is increased as the distance becomes larger.

According to one embodiment of the present invention, by increasing the L length of the gate electrode as the distance from the substrate contact whose potential is fixed at the ground potential becomes larger, that is, as the comb tooth of the gate electrode is located more inward, the respective comb teeth of the gate electrode uniformly enter snap-back operation, which enables avoidance of local concentration of current and obtainment of a desired ESD tolerance.

DETAILED DESCRIPTION OF THE INVENTION

In the following, embodiments for carrying out the invention are described in detail with reference to the attached drawings. Further, in the following description, only a contact connected to a ground potential via metal interconnecting line is referred to as a substrate contact.

First Embodiment

Figure 1:
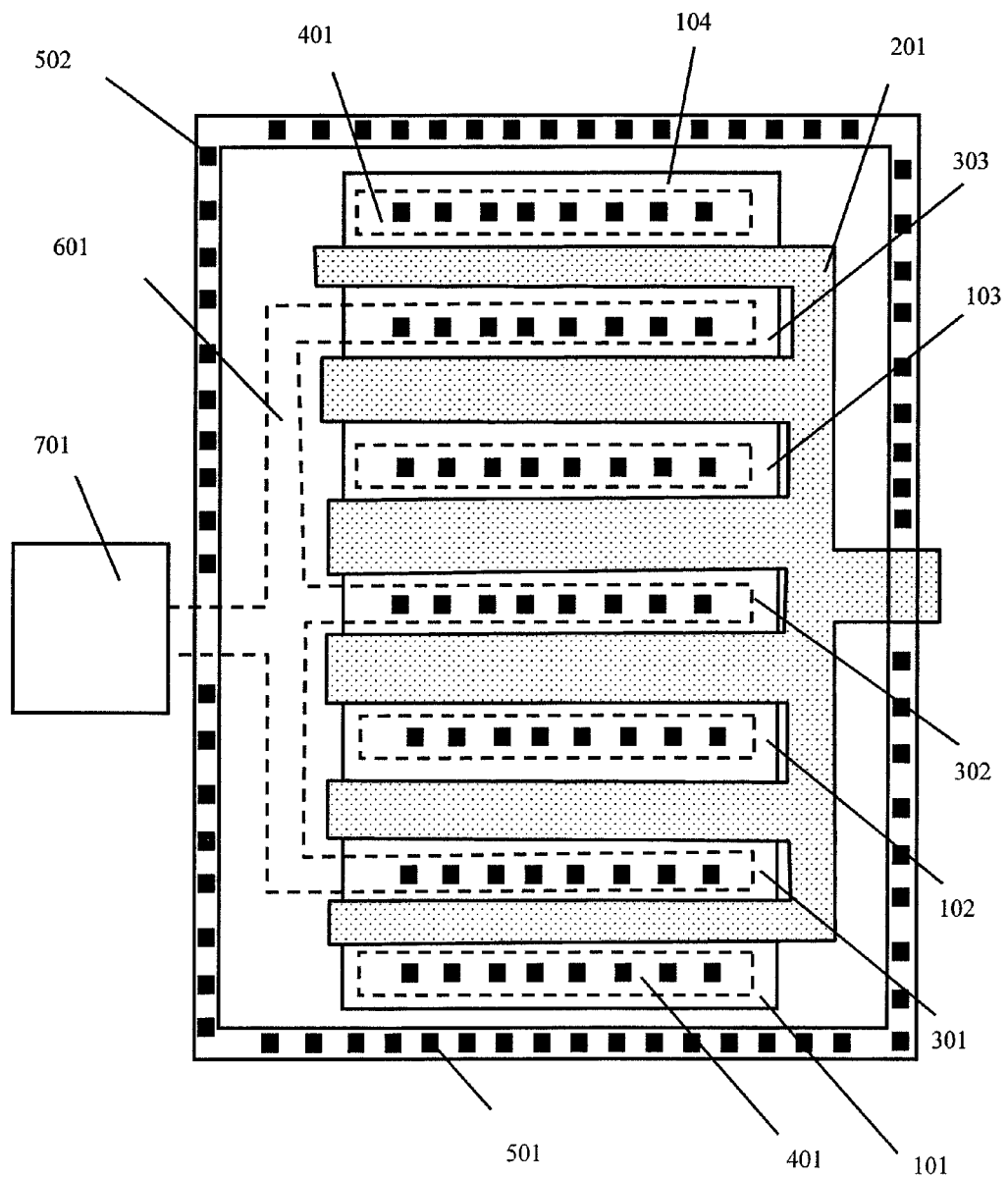
FIG. 1 is a schematic plan view illustrating an N-type MOS transistor for ESD protection of a semiconductor device according to a first embodiment of the present invention.

FIG. 1 is a schematic plan view illustrating an N-type MOS transistor for ESD protection of a semiconductor device according to a first embodiment of the present invention.

A first source region 101 and a first drain region 301, which are N-type high concentration impurity regions, are formed. A gate insulating film, which is a silicon oxide film or the like, is provided between the first source region 101 and the first drain region 301. A gate electrode 201 formed of polysilicon or the like is formed on an upper surface of the gate insulating film. A second source region 102 is formed next to the first drain region 301 with the gate electrode 201 interposed therebetween. A second drain region 302 is formed next to the second source region 102 with the gate electrode 201 interposed therebetween. In a pattern in which the above is repeated similarly, a third source region 103, a third drain region 303, and a fourth source region 104 are formed with the electrode 201 interposed thereamong. In the first embodiment, a case is described in which four source regions, three drain regions, and a gate electrode having six comb teeth are provided. In this case, the drain regions 301, 302, and 303 are connected to an external connection terminal 701 via a first metal interconnecting line 601. The six comb teeth of the gate electrode are in the shape of a comb as a whole. Source regions and drain regions are alternately provided among the comb teeth. The transistor is of a multi-finger type in which six MOS transistors are combined.

A ground potential is supplied to the first source region 101, the second source region 102, and the third source region 103 from metal interconnecting line in an upper layer formed of a material containing a high-melting point metal or the like, the metal interconnecting line being connected to a ground potential supply line 401 formed of a metal material containing a high-melting point metal or the like. Substrate contacts 501 arranged in a direction in parallel with a channel width and substrate contacts 502 arranged in a direction in parallel with a channel length are provided at regular intervals on a guard ring around an outer periphery of the N-type MOS transistor for ESD protection.

In this case, a length L of the comb tooth of the gate electrode 201 is reduced as the distance from the substrate contact 501 provided in the direction in parallel with the channel width (lateral direction in FIG. 1) to the comb tooth becomes smaller, and the length L is the largest in the innermost comb tooth of the gate electrode which is located the farthest from the substrate contact 501. Specifically, in FIG. 1, setting is made so that, among the six comb teeth of the gate electrode, the uppermost and the lowermost comb teeth have the smallest length L, and the two comb teeth in the middle have the largest L. This is because bipolar operation is less liable to occur as the potential of a substrate region in which a channel is formed is more firmly fixed by a nearby substrate contact to the ground potential. By setting the lengths L of the respective comb teeth of the gate electrode 201 as described above, difference in timing of the start of bipolar operation which occurs in the channels under the respective comb teeth of the gate electrode 201 due to difference in potential of the substrate caused by the difference in distance to the substrate contact can be eliminated to cause the timing to be uniform, thereby enabling uniform operation of the entire N-type MOS transistor for ESD protection. In the embodiment illustrated in FIG. 1, in order to eliminate the difference in timing of the start of bipolar operation caused by the difference in distance between the substrate contacts 501 arranged in the direction in parallel with the channel width of the N-type MOS transistor for ESD protection and the comb teeth of the gate electrode 201, the lengths L of the comb teeth of the gate electrode 201 are adjusted. A unit gate electrode corresponding to one comb tooth has a fixed width, and is basically in the shape of a rectangle.

Second Embodiment

Figure 2:
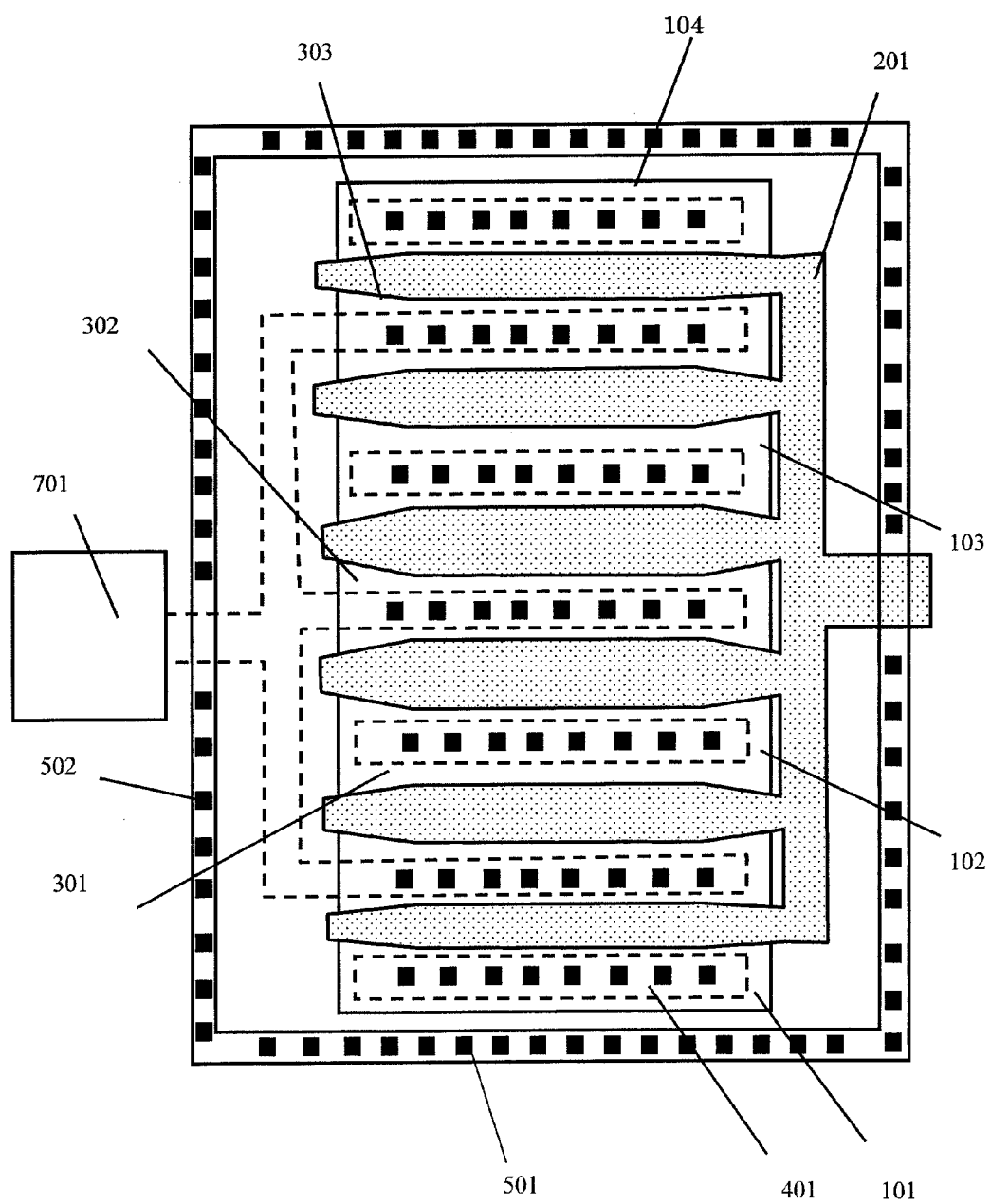
FIG. 2 is a schematic plan view illustrating an N-type MOS transistor for ESD protection of a semiconductor device according to a second embodiment of the present invention.

FIG. 2 is a schematic plan view illustrating an N-type MOS transistor for ESD protection of a semiconductor device according to a second embodiment of the present invention. Like reference numerals are used to designate members corresponding to those illustrated in FIG. 1. The second embodiment is different from the first embodiment illustrated in FIG. 1 in that the length L of the unit gate electrode is not fixed. In FIG. 2, not only the substrate contacts 501 arranged in the direction in parallel with the channel width which is the lateral direction in the figure but also the substrate contacts 502 arranged in the direction in parallel with the channel length which is a longitudinal direction in the figure are provided. In consideration of this, the lengths L around distal ends and proximal ends at which the distance to the substrate contact 502 is small of the comb teeth of the gate electrode 201 are set smaller than the lengths L around intermediate portions, respectively.

Such a structure enables elimination of difference in timing of the start of bipolar operation caused by the difference in distance between the substrate contact 501 arranged in the direction in parallel with the channel width and the comb tooth of the gate electrode 201 and by the difference in distance between the substrate contact 502 arranged in the direction in parallel with the channel length and the comb tooth of the gate electrode 201 of the N-type MOS transistor for ESD protection.

Third Embodiment

Figure 3:
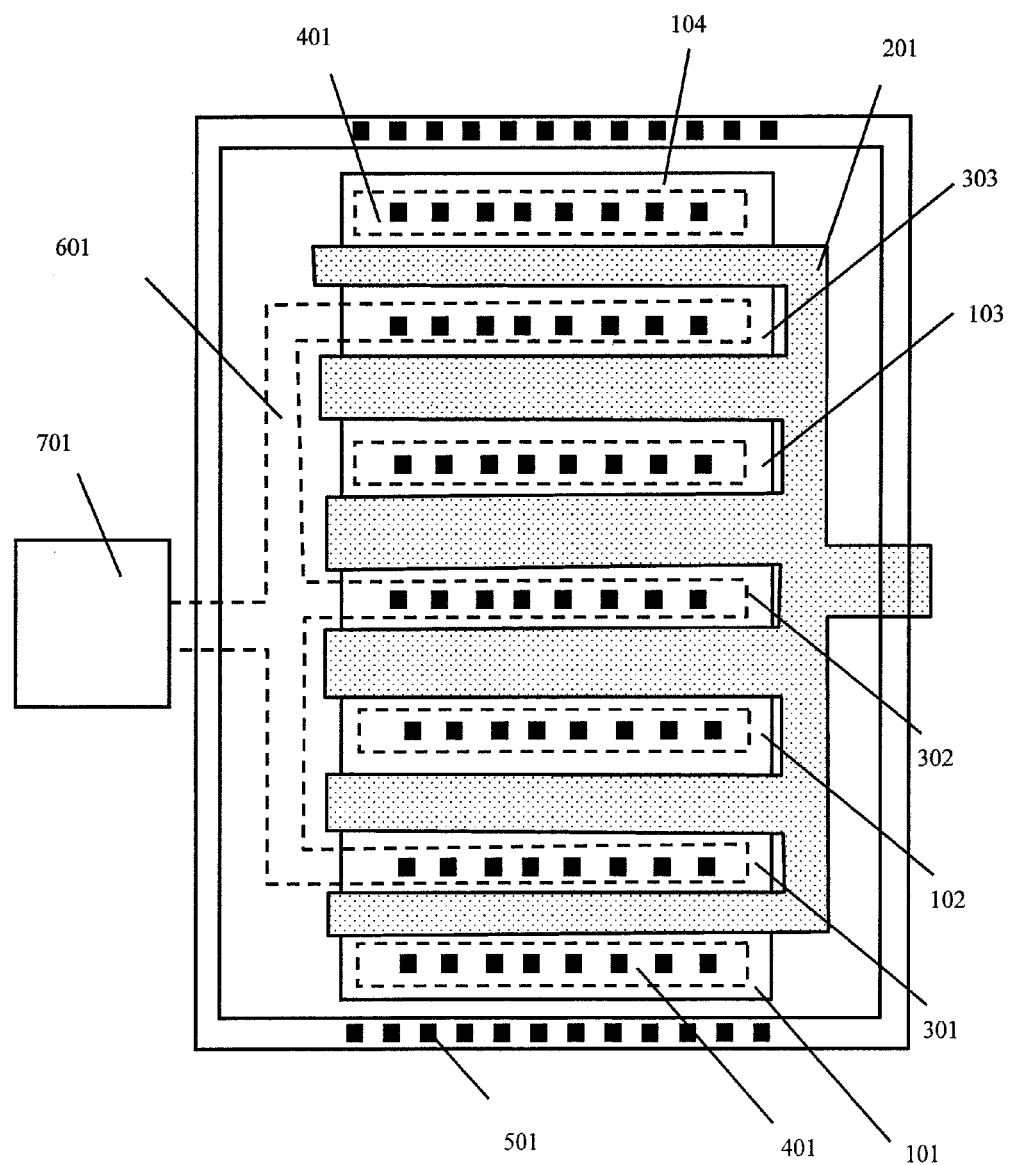
FIG. 3 is a schematic plan view illustrating an N-type MOS transistor for ESD protection of a semiconductor device according to a third embodiment of the present invention.

FIG. 3 is a schematic plan view illustrating an N-type MOS transistor for ESD protection of a semiconductor device according to a third embodiment of the present invention. Like reference numerals are used to designate members corresponding to those illustrated in FIG. 1. The third embodiment is different from the first embodiment illustrated in FIG. 1 in that, by omitting the substrate contacts arranged in the direction in parallel with the channel length of the N-type MOS transistor for ESD protection, the influence of difference in substrate potential in the direction in parallel with the channel length is eliminated, and only the substrate contacts 501 arranged in the direction in parallel with the channel width are provided on the guard ring around the outer periphery. The comb teeth of the gate electrode 201 in this case are provided so that, similarly to the case of the first embodiment, the length L of the comb tooth of the gate electrode is reduced as the distance from the substrate contact 501 arranged in the direction in parallel with the channel width becomes smaller, and the length L is the largest in the innermost comb tooth of the gate electrode which is located the farthest from the substrate contact 501. The unit gate electrode is in the shape of a rectangle.

Fourth Embodiment

Figure 4:
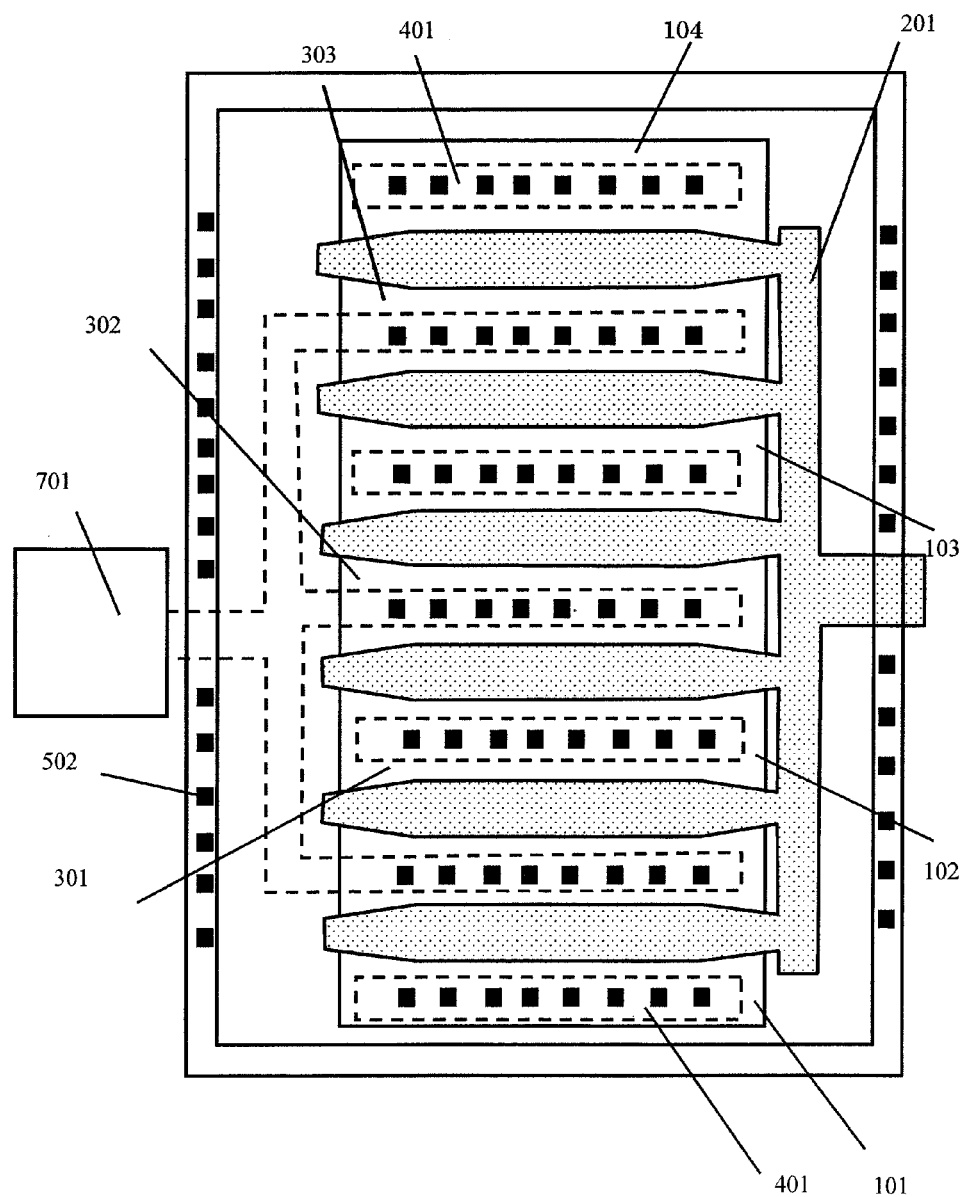
FIG. 4 is a schematic plan view illustrating an N-type MOS transistor for ESD protection of a semiconductor device according to a fourth embodiment of the present invention.

FIG. 4 is a schematic plan view illustrating an N-type MOS transistor for ESD protection of a semiconductor device according to a fourth embodiment of the present invention. Like reference numerals are used to designate members corresponding to those illustrated in FIG. 1.

In this embodiment, only the substrate contacts 502 arranged in the direction in parallel with the channel length are provided on the guard ring around the outer periphery, and the shape of the gate electrode is formed in consideration of this arrangement. Specifically, the lengths L around the distal ends and the proximal ends at which the distance to the substrate contact 502 is small of the comb teeth of the gate electrode 201 are set smaller than the lengths L around intermediate portions, respectively, and all the six comb teeth of the gate electrode 201 are in the same shape.

The fourth embodiment is different from the first embodiment illustrated in FIG. 1 in that the L length of the unit gate electrode is not fixed. The fourth embodiment is different from the second embodiment illustrated in FIG. 2 in that the lengths L of the respective unit gate electrodes are identical to each other.

Such a structure enables elimination of difference in timing of the start of bipolar operation caused by the difference in distance between the substrate contact 502 arranged in the direction in parallel with the channel length and the comb tooth of the gate electrode 201.

What is claimed is:

1. A semiconductor device having an ESD protection element which utilizes an N-type MOS transistor having an integral structure of a plurality of transistors, the semiconductor device comprising:
   a plurality of drain regions and a plurality of source regions alternately arranged each other;
   a gate electrode formed between each of the plurality of drain regions and each of the plurality of source regions; and
   a substrate contact to which a metal interconnecting line fixed at a ground potential is connected, the substrate contact being formed around the plurality of drain regions, the plurality of source regions, and the gate electrode,
   wherein a length L, which is a length of the gate electrode in a channel direction, of a comb tooth of the gate electrode formed close to the substrate contact is smaller than the L length of a comb tooth formed away from the substrate contact.

2. A semiconductor device according to claim 1, wherein the L length of the gate electrode is reduced as a distance from the substrate contact arranged in parallel with a channel width direction of the gate electrode becomes smaller.

3. A semiconductor device according to claim 1, wherein the L length of the gate electrode is reduced as a distance from the substrate contact arranged in parallel with a channel length direction of the gate electrode becomes smaller.

4. A semiconductor device according to claim 1, wherein the L length of the comb teeth of the gate electrode becomes smaller as a distance from the substrate contacts arranged in parallel with a channel width direction of the comb teeth becomes smaller.

5. A semiconductor device according to claim 2, wherein the substrate contact is provided only on two sides in parallel with the channel width direction of the gate electrode.

6. A semiconductor device according to claim 3, wherein the substrate contact is provided only on two sides in parallel with the L length direction of the gate electrode.

7. A semiconductor device according to claim 4, wherein the substrate contacts are provided only on two sides of the guard ring in parallel with the channel width direction of the comb teeth.

8. A semiconductor device having an ESD protection element which utilizes an N-type MOS transistor having an integral structure of a plurality of transistors, the semiconductor device comprising:
   a plurality of drain regions alternately arranged with a plurality of source regions;
   a gate electrode provided between each adjacent pair of alternating drain and source regions and;
   a plurality of substrate contacts formed around and spaced from the drain regions, source regions and gate electrode and connected to a metal interconnecting line fixed at a ground potential,
   wherein a channel length L of the gate electrode between the pairs of alternating drain and source regions is reduced as a distance of the gate electrode from the substrate contacts becomes smaller.

9. A semiconductor device having an ESD protection element which utilizes an N-type MOS transistor having an integral structure of a plurality of transistors, the semiconductor device comprising:
   a plurality of drain regions alternately arranged with a plurality of source regions;
   a gate electrode having a comb configuration with comb teeth, each comb tooth extending between an adjacent pair of drain and source regions; and
   a guard ring having substrate contacts to which a metal interconnecting line fixed at a ground potential is connected, the guard ring being formed around the drain regions, the source regions, and the gate electrode,
   wherein a length L, which is a length of the gate electrode in a channel direction, of a comb tooth of the gate electrode located closer to the substrate contacts is smaller than the L length of a comb tooth located farther from the substrate contacts.

10. A semiconductor device according to claim 9, wherein the L length of the comb teeth of the gate electrode becomes smaller as a distance from the substrate contacts arranged in parallel with a channel length direction of the comb teeth becomes smaller.

11. A semiconductor device according to claim 10, wherein the substrate contacts are provided only on two sides of the guard ring in parallel with the L length direction of the comb teeth.

* * * * *